US011967377B2

(12) United States Patent
Deshpande et al.

(10) Patent No.: US 11,967,377 B2
(45) Date of Patent: Apr. 23, 2024

(54) DYNAMICALLY GATED SEARCH LINES FOR LOW-POWER MULTI-STAGE CONTENT ADDRESSABLE MEMORY

(71) Applicant: MediaTek Singapore Pte. Ltd., Singapore (SG)

(72) Inventors: Chetan Deshpande, San Jose, CA (US); Sushil Kumar, San Jose, CA (US); Gajanan Sahebrao Jedhe, San Jose, CA (US); Ritesh Garg, San Jose, CA (US); Gaurang Prabhakar Narvekar, San Jose, CA (US)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 197 days.

(21) Appl. No.: 17/522,214

(22) Filed: Nov. 9, 2021

(65) Prior Publication Data

US 2022/0223207 A1   Jul. 14, 2022

Related U.S. Application Data

(60) Provisional application No. 63/135,038, filed on Jan. 8, 2021.

(51) Int. Cl.
*G11C 15/04* (2006.01)

(52) U.S. Cl.
CPC .................................. *G11C 15/04* (2013.01)

(58) Field of Classification Search
CPC .... G11C 15/04; G11C 15/00; G06F 16/90339

(Continued)

(56) References Cited

U.S. PATENT DOCUMENTS 6,374,326 B1   4/2002 Kansal
6,687,785 B1 *  2/2004 Pereira ................... G11C 15/00
                                                    711/108

(Continued)

FOREIGN PATENT DOCUMENTS

EP              573208 A1 * 12/1993 ............. G06T 9/005
WO  WO-2020232128 A1 * 11/2020 ....... G11C 11/40611

OTHER PUBLICATIONS

Maniotis, Pavlos, Integrated Optical Content Addressable Memories (CAM) and Optical Random Access Memories (RAM) for Ultra-Fast Address Look-Up Operations, 2017, Applied Sciences. All pages. (Year: 2017).*

(Continued)

*Primary Examiner* — Michael T Tran
(74) *Attorney, Agent, or Firm* — Tong J. Lee

(57) ABSTRACT

A content addressable memory (CAM) device includes multiple CAM sub-banks Each CAM sub-bank includes an array of CAM cells arranged in rows and columns and partitioned into a first stage and a second stage along a column dimension. Each CAM sub-bank further includes first-stage match lines (MLs), first-stage search line (SL) pairs, second-stage MLs, and second-stage SL pairs. Each second-stage SL pair is coupled to a column of CAM cells in the second stage and is gated by an SL enable (SL_EN signal). Each CAM sub-bank further includes a circuit operative to receive all of the first-stage MLs as input and de-assert the SL_EN signal when none of the first-stage MLs indicate a match. De-assertion of the SL_EN signal blocks a second portion search key from being provided to the second-stage SL pairs.

19 Claims, 6 Drawing Sheets

(58) Field of Classification Search
USPC .................................. 365/49, 230.06, 49.17
See application file for complete search history.

(56) References Cited

U.S. PATENT DOCUMENTS

| | | | |
|---|---|---|---|
| 7,219,188 B1* | 5/2007 | Pereira | G11C 15/00 |
| | | | 711/108 |
| 7,920,399 B1 | 4/2011 | Nataraj | |
| 8,031,501 B1 | 10/2011 | Nataraj | |
| 8,467,213 B1* | 6/2013 | Channabasappa | G11C 15/00 |
| | | | 365/49.1 |
| 8,493,763 B1 | 7/2013 | Argyres | |
| 8,787,059 B1* | 7/2014 | Iyengar | G06F 16/90339 |
| | | | 365/49.16 |
| 10,261,487 B1* | 4/2019 | Buchanan | G11C 15/04 |
| 10,453,531 B1* | 10/2019 | Petti | G11C 5/025 |
| 11,031,080 B1* | 6/2021 | Ogura Iwasaki | G11C 15/04 |
| 11,211,111 B1* | 12/2021 | Mathur | G11C 11/4094 |
| 2007/0097722 A1 | 5/2007 | Phan | |
| 2014/0218994 A1* | 8/2014 | Argyres | G11C 5/14 |
| | | | 365/49.17 |
| 2015/0381202 A1* | 12/2015 | Satpathy | H03M 7/3084 |
| | | | 711/108 |
| 2018/0309776 A1* | 10/2018 | Sun | H04L 43/028 |
| 2020/0006383 A1* | 1/2020 | Petti | H10B 51/30 |
| 2020/0365208 A1* | 11/2020 | Schreck | G11C 11/4074 |
| 2021/0158870 A1* | 5/2021 | Wang | G06N 3/063 |
| 2021/0183437 A1* | 6/2021 | Wang | G11C 17/14 |
| 2022/0028455 A1* | 1/2022 | Sawada | G11C 15/04 |
| 2022/0138204 A1* | 5/2022 | Graves | G11C 27/005 |
| | | | 707/694 |

OTHER PUBLICATIONS

The Extended European Search Report regarding EP 22 15 0235 dated Jun. 13, 2022.

* cited by examiner

DYNAMICALLY GATED SEARCH LINES FOR LOW-POWER MULTI-STAGE CONTENT ADDRESSABLE MEMORY

CROSS-REFERENCE TO RELATED APPLICATIONS

This application claims the benefit of U.S. Provisional Application No. 63/135,038 filed on Jan. 8, 2021, the entirety of which is incorporated by reference herein.

TECHNICAL FIELD

The invention relates to a low-power design of a content addressable memory (CAM) device.

BACKGROUND

Content addressable memory (CAM) is generally used in high-speed searching applications. A CAM device compares a search key against data stored in each row of a CAM cell array and returns the address of matching data. When used in a network switch, CAM can speed up operations of routing table lookup and data forwarding.

In a CAM device, each CAM cell is coupled to a match line that spans over the corresponding row and a search line pair (SL and SLB) that spans over the corresponding column. The match lines and the search lines consume the most significant portion of overall dynamic power; e.g., as high as 80% of the dynamic power. One common scenario for CAM applications is where the majority of CAM rows result in a miss when compared against a search key. Before the search, all match lines and all search line pairs are pre-charged. During the search, each search line pair (SL and SLB) are driven to opposite logic states (i.e., one logic high and the other logic low) according to the corresponding bit of the search key. Thus, one of the SL and SLB is toggled every cycle. When a CAM row does not match the search key, the corresponding match line is discharged (e.g., to ground). If all of the CAM rows are mismatched, all of the match lines charge and discharge every cycle, thus consuming the maximum power.

Reducing CAM power consumption is a key to reducing the overall dynamic power at the chip level for a network switch.

SUMMARY

In one embodiment, a content addressable memory (CAM) device is provided. The CAM device includes multiple CAM sub-banks. Each CAM sub-bank includes an array of CAM cells arranged in rows and columns and partitioned into a first stage and a second stage along a column dimension. Each CAM sub-bank further includes first-stage match lines (MLs), and each first-stage ML is coupled to a first-stage row segment of CAM cells and indicating whether a match is found in the first-stage row segment for a first portion search key. Each CAM sub-bank further includes first-stage search line (SL) pairs and second-stage MLs. Each second-stage ML is coupled to a second-stage row segment of CAM cells. Each CAM sub-bank further includes second-stage SL pairs, and each second-stage SL pair is coupled to a column of CAM cells in the second stage and is gated by an SL enable (SL_EN signal). Each CAM sub-bank further includes a circuit operative to receive all of the first-stage MLs as input and de-assert the SL_EN signal when none of the first-stage MLs indicate a match. De-assertion of the SL_EN signal blocks a second portion search key from being provided to the second-stage SL pairs.

In another embodiment, a method is performed by each CAM sub-bank of a CAM device. Each CAM sub-bank includes an array of CAM cells arranged in rows and columns, and is partitioned into a first stage and a second stage along a column dimension. The method comprises the steps of: comparing a first portion search key against stored data in first-stage row segments of CAM cells; receiving input from first-stage match lines (MLs); and generating a search line enable (SL_EN) signal based on logic states of all of the first-stage MLs. The SL_EN signal is a gating signal for second-stage search line (SL) pairs coupled to the respective columns of CAM cells in the second stage. The method further comprises the step of de-asserting the SL_EN signal when none of the first-stage MLs indicate a match. De-assertion of the SL_EN signal blocks a second portion search key from being provided to the second-stage SL pairs.

Advantages of the invention will be explained in detail in the following description.

BRIEF DESCRIPTION OF THE DRAWINGS

The invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

Figure 1:
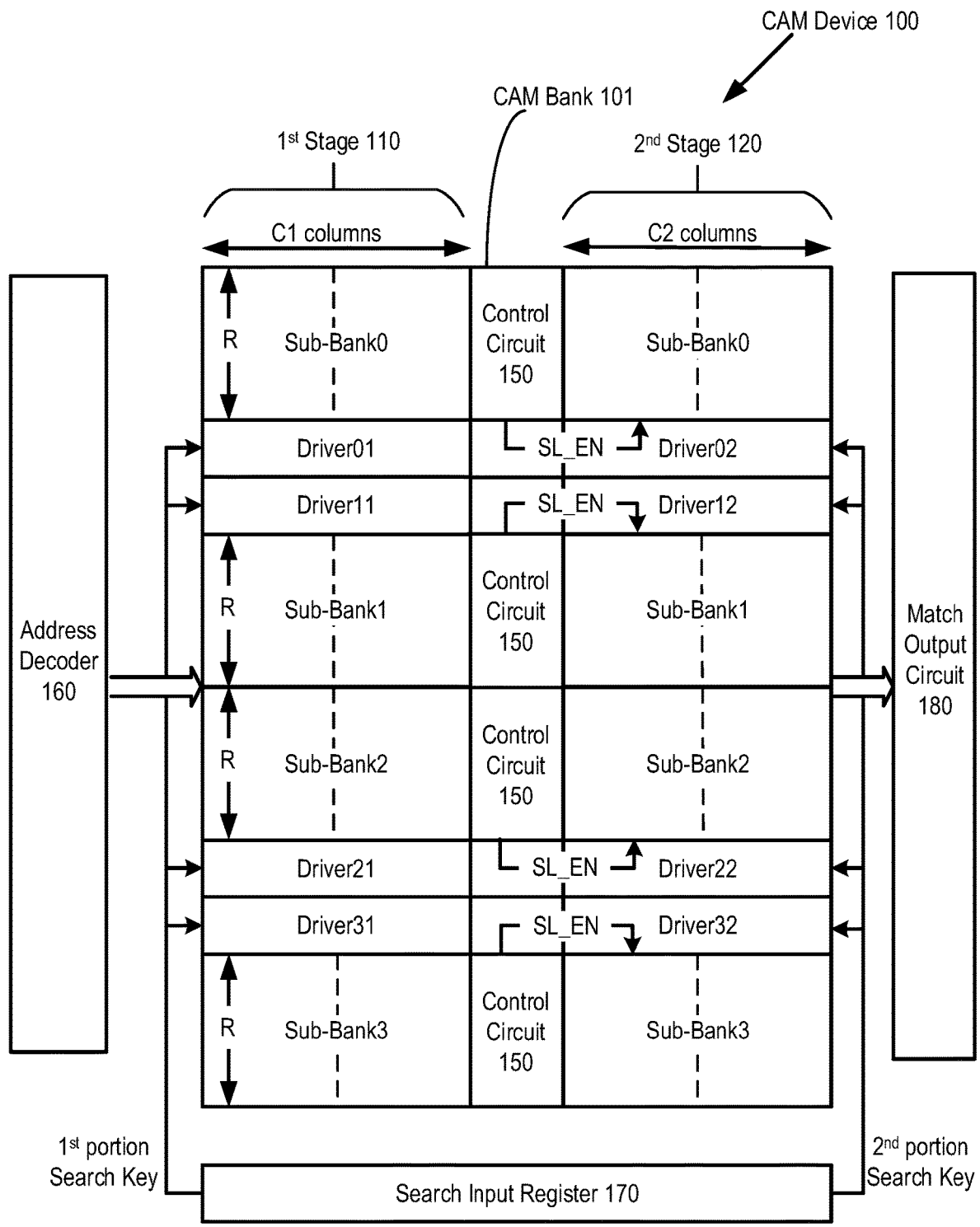
FIG. 1 illustrates a CAM device according to one embodiment.

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide an ultra-low-power content addressable memory (CAM) device. The term "CAM" as used herein encompasses different types of CAMs, such as binary CAM, ternary CAM (TCAM), quaternary CAM (QCAM), or other types of CAMs. In one embodiment, the CAM device disclosed herein may be part of a system-on-a-chip (SOC), such as an SOC in a processing and/or communication device (e.g., a network device).

In one usage scenario, a CAM device may be used to store a lookup table, which is searched with a search key for a matching entry. In the lookup table, a set of rules (e.g., access control (ACL) rules or other rules) may be stored in the order of priority. When multiple entries match the search key, the highest address of the matching entry is output as the matching address. Correlated rules are likely to be programmed adjacent to each other and occupy adjacent entries in the lookup table. Therefore, if a given entry matches a search key representing a given rule, it is likely that additional matches, if any, might occur in correlated rules that are stored adjacent to the given entry. For example, the additional matches may be found in entries that have a slightly higher or lower priority than the given entry, and, therefore, are stored close to the given entry. Thus, a pattern of spatial locality often exists in the search results. The sub-bank level dynamically gated search lines technique disclosed herein seeks to take advantage of the spatial locality of likely matches for a CAM device to reduce power.

The CAM device disclosed herein may include any number of memory banks and each memory bank is an array of CAM cells arranged in rows and columns Each memory bank may be partitioned across the row dimension into multiple sub-banks Each sub-bank may be further partitioned across the column dimension into at least two stages, where the second stage of the sub-bank is activated (i.e., enabled) for search only when a match is found in the first stage of the same sub-bank. The conditional enablement of the second-stage search is performed at the sub-bank level. That is, each sub-bank may enable or disable its second-stage search independently of the other sub-banks. The sub-bank level enablement exploits the aforementioned spatial locality, as matching entries are often found in the same sub-bank. The sub-banks that do not have a match in their first stage can disable the search in their second stage. More specifically, a search enable signal is dynamically generated according to the search result in the first stage to gate the search lines in the second stage. When the search enable signal is de-asserted (e.g., to logic low) due to no match in the first stage, the second-stage search lines are disabled from search and disabled from the aforementioned toggling. Thus, a significant amount of power can be saved and, therefore, improves the overall performance of the device.

In the following description, the terms "connect," "couple" and their derivatives, are used to indicate that two or more elements, which may or may not be in direct physical contact, have an electrical connection between or among them. Thus, the terms "connected" and "coupled" hereinafter are used equivalently to "electrically connected" and "electrically coupled," respectively.

FIG. 1 illustrates a CAM device 100 according to one embodiment. The CAM device 100 includes a CAM bank 101 partitioned into four sub-banks (e.g., Sub-Bank0, Sub-Bank1, Sub-Bank2, and Sub-Bank3) along the row dimension. It is understood that the CAM device 100 may include any number of CAM banks and each CAM bank may include multiple sub-banks not limited to four. The CAM bank 101 has C columns of CAM cells, and C is equal to the number of bits of a search key to be compared with the stored data in the CAM cells. In the example of four sub-banks, each sub-bank has R rows and C columns of CAM cells and the CAM bank 101 has (4×R) rows and C columns.

In one embodiment, each sub-bank is further partitioned into multiple stages along the column dimension; e.g., a first stage 110 and a second stage 120. The first stage 110 has C1 columns and the second stage 120 has C2 columns, where C1+C2=C. In one embodiment of a symmetric cell structure, C1=C2; in an alternative embodiment of an asymmetric cell structure, C1 and C2 may be different numbers. A CAM bank 101 with an asymmetric cell structure may have C1<C2. As will be described in further detail below, search lines in the second stage 120 can be disabled to save power when no match is found in the first stage 110 of the same sub-bank. When most searches in the first stage 110 result in mismatches, having a wider second stage (i.e., C1<C2) may save more power than a symmetric cell structure (i.e., C1=C2) as wider second stage contains more search lines that can potentially be disabled. However, it should be understood that the dynamically gated search lines technique described herein applies to any C1 and C2 of positive integer values.

The CAM device 100 also includes a search input register 170, which stores a search key to be compared against the data stored in the rows of CAM cells. In the example of FIG. 1, each row of CAM cells in a sub-bank is partitioned into a first-stage row segment and a second-stage row segment. The first portion search key (e.g., the first C1 bits) is compared against the data stored in the first-stage row segments, and the second portion search key (e.g., the subsequent C2 bits) is compared against the data stored in the second-stage row segments. The search key is provided from the search input register 170 to the CAM cells of each sub-bank via a driver coupled to the sub-bank.

As will be described in detail with reference to FIG. 3 and FIG. 4, each CAM cell, in both stages 110 and 120 of a sub-bank, is coupled to a match line (ML) and two complementary search lines, referred to as a search line (SL) pair. Each ML is coupled to the CAM cells in the same row segment, and each SL pair is coupled to the CAM cells in the same column. An ML in the first stage 110 is referred to as the first-stage ML (i.e., ML1) and an ML in the second stage 120 is referred to as the second-stage ML (i.e., ML2). An SL pair in the first stage 110 is referred to as the first-stage SL pair (i.e., SL1 and SLB1) and an SL pair in the second stage 120 is referred to as the second-stage SL pair (i.e., SL2 and SLB2).

In the example of FIG. 1, a first-stage driver (e.g., Driver01, Driver 11, Driver 21, or Driver 31) receives a first portion search key and drives the first-stage SL pairs according to the bit values of the first portion search key. A second-stage driver (e.g., Driver02, Driver 12, Driver 22, or Driver 32) receives a second portion search key and drives the second-stage SL pairs according to the bit values of the second portion search key. For example, if a search key bit value is 1, the corresponding SL may be driven to logic high and SLB to logic low. According to embodiments of the invention, each second-stage SL pair is enabled to be driven to opposite logic levels according to the second portion search key when the first stage 110 of the same sub-bank asserts an SL enable (SL_EN) signal (e.g., to logic high). When the first stage 110 of a sub-bank de-asserts the SL_EN signal (e.g., SL_EN is at logic low), the second-stage SL pairs of the same sub-bank are disabled and no compare operations can be performed in the second stage 120.

FIG. 1 further illustrates a control circuit 150 between each pair of corresponding first stage 110 and second stage 120. In an alternative embodiment, the control circuit 150 may be placed in another location in the sub-bank different from what is shown in FIG. 1. Furthermore, different parts of the control circuit 150 may be placed in different or separate locations of the sub-bank. The control circuit 150 of each sub-bank includes, among others, circuit components that generate the SL_EN signal for the sub-bank.

Moreover, the CAM device 100 includes an address decoder 160 and a match output circuit 180. The address decoder 160 includes circuitry to select corresponding rows of CAM cells to read, write, and/or other operations in response to an address received from an address bus or another circuit. When a match is found in the CAM bank 101, the match output circuit 180 generates a match signal indicating the index of the row that contains the matching entry.

In some embodiments, each of the first stage 110 and the second stage 120 in a sub-bank may be further partitioned into a number of CAM blocks (e.g., two CAM blocks in each stage in this example). The partitioning is indicated by a dashed line in each stage in FIG. 1. For example, the first stage 110 of Sub-Bank0 may include a left CAM block and a right CAM block, each having (C1/2) columns and R rows of CAM cells. A left-half row segment of CAM cells in the left CAM block is coupled to a left ML, and the corresponding right-half row segment in the right CAM block is coupled to a right ML. The signals on the left and right MLs are combined (e.g., by an AND gate) to generate a first-stage ML signal for the row segment. The second stage 120 of Sub-Bank0 may be similarly partitioned into blocks of left and right. It is understood that each stage of a sub-bank may be partitioned into any number of blocks of any block width (i.e., number of columns), as determined by circuit designs. In the following description, the terms "first-stage ML" and "second-stage ML" refer to the combined right and left MLs in the first stage and the second stage, respectively, when such block partitioning is used.

Figure 2:
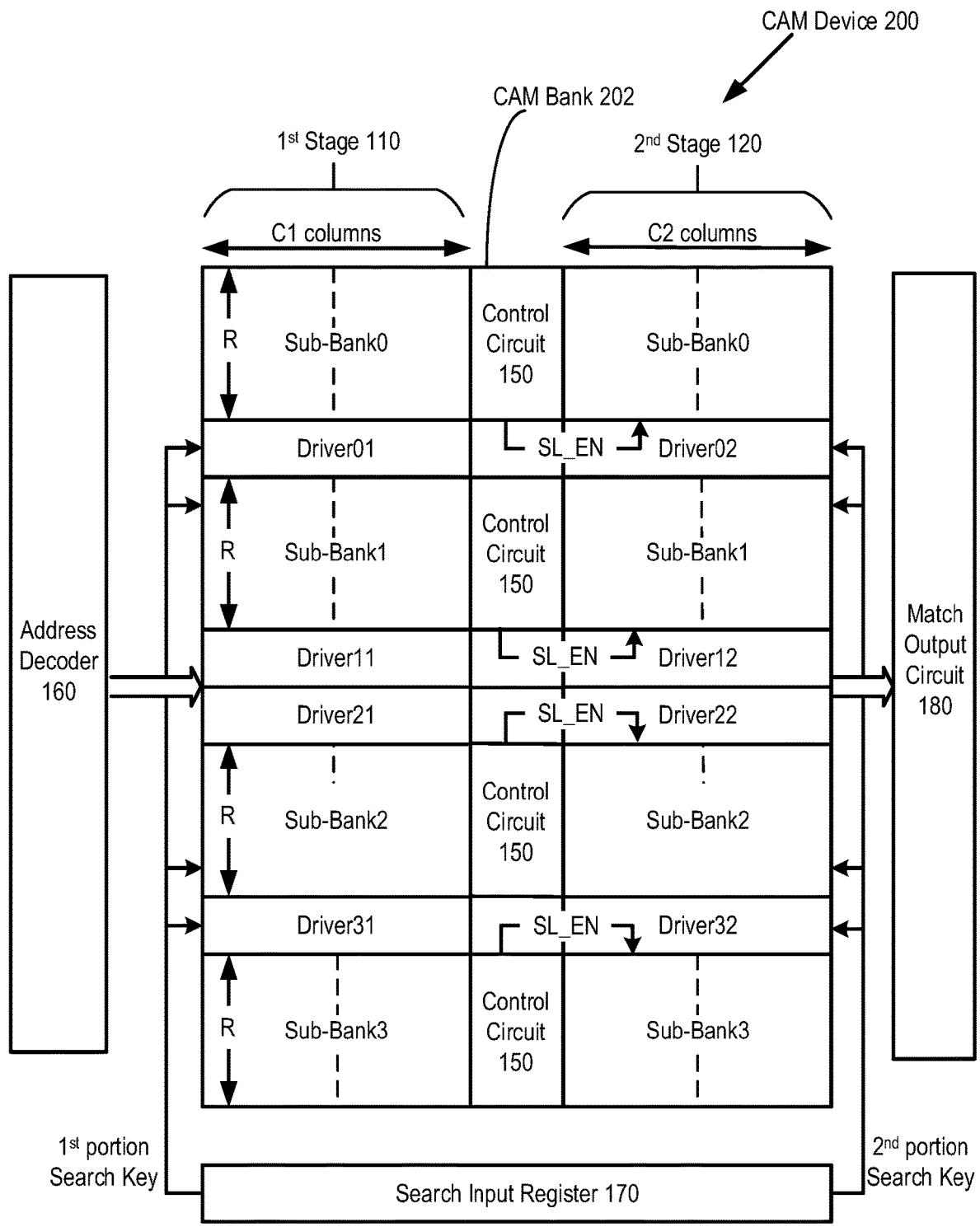
FIG. 2 illustrates a CAM device according to another embodiment.

FIG. 2 illustrates a CAM device 200 including a CAM bank 202 partitioned into four sub-banks according to another embodiment. The operations performed by the CAM device 200 and the signals generated by the CAM bank 202 are the same as those of the CAM device 100 and the CAM bank 101. However, the placement of the drivers in the CAM device 200 is different from the placement of the drivers in the CAM device 100. More specifically, in the CAM device 100, the drivers of Sub-Bank0 and Sub-Bank1 are immediately adjacent to each other, and the drivers of Sub-Bank2 and Sub-Bank3 are also immediately adjacent to each other. In the CAM device 200, the drivers of Sub-Bank1 and Sub-Bank2 are immediately adjacent to each other, and the drivers of Sub-Bank0 and Sub-Bank 3 are separate from the other drivers. In alternative embodiments, the placement of the drivers in each sub-bank may be different from the examples of FIG. 1 and FIG. 2. It is understood that the disclosed dynamically gated search lines technique can apply to different placement of the drivers in a CAM device.

Figure 3:
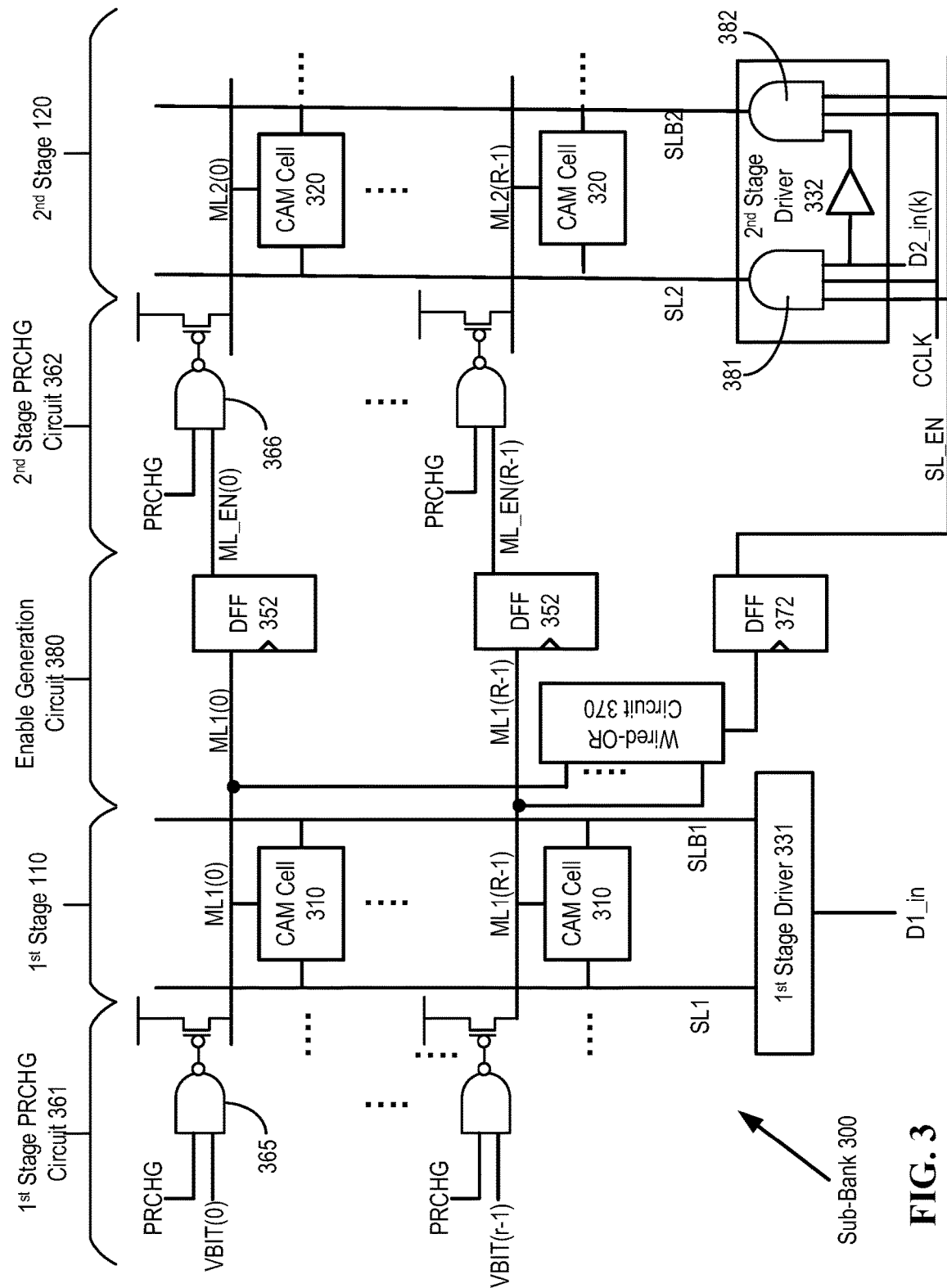
FIG. 3 illustrates a sub-bank of a CAM device according to one embodiment.

FIG. 3 illustrates further details of a sub-bank 300 according to one embodiment. The sub-bank 300 can be any of the sub-banks shown in FIG. 1 and FIG. 2. The sub-bank 300 includes the first stage 110, the second stage 120, and a first-stage pre-charge (PRCHG) circuit 361, a second-stage PRCHG circuit 362, and an enable generation circuit 380. The first stage 110 includes an array of CAM cells 310 and the second stage 120 includes an array of CAM cells 320. For simplicity of the illustration, not all rows and columns of CAM cells are shown in each of the first stage 110 and the second stage 120.

Each CAM cell (310 and 320) is located in a row segment and a column. Each CAM cell is coupled to a match line (ML) and a search line pair (SL and SLB). Within the sub-bank 300, each first-stage ML (i.e., ML1) is coupled to all CAM cells 310 in the same first-stage row segment, and each second-stage ML (i.e., ML2) is coupled to all CAM cells 320 in the same second-stage row segment. Each first-stage SL pair (SL1 and SLB1) is coupled to all CAM cells 310 in the same column of the first stage 110, and each second-stage SL pair (e.g., SL2 and SLB2) is coupled to all CAM cells 320 in the same column of the second stage 120. The search key is the combined data input D1_in and D2_in to the first stage 110 and the second stage 120, respectively. For the purpose of illustration, D2_in(k) represents one search key bit input to the second stage 120. A first-stage driver 331 and a second-stage driver 332 drive the corresponding SL pairs according to the corresponding data input values.

The first-stage PRCHG circuit 361, the second-stage PRCHG circuit 362, and the enable generation circuit 380 may be part of the control circuit 150 in FIG. 1 and FIG. 2, and the placement of these circuits 361, 362, and 380 may be different from what is shown in FIG. 3 in alternative embodiments. For simplicity of the illustration, not all clock signals are shown in the example of FIG. 3.

For each row segment in the first stage 110, the first-stage PRCHG circuit 361 includes an AND gate 365 that receives a pre-charge (PRCHG) signal and a row-specific valid bit (VBIT) indicator. The VBIT indicator indicates whether the stored data in the corresponding row is valid. The VBIT indicator gates pre-charging of the first-stage ML. Using the top row segment as an example, when VBIT(0) is logic high, the corresponding first-stage ML (i.e., ML1(0)) is pre-charged to logic high. If the first portion search key matches the data stored in the top row segment of CAM cells 310, ML1(0) remains high and propagates through a corresponding flip-flop; e.g., a D flip-flop 352 in the next clock to serve as an ML enable signal (ML_EN(0)) for the top row segment in the second stage 120. An alternative embodiment may not include the VBIT indicators in the first-stage PRCHG circuit 361.

For each row segment in the second stage 110, the second-stage PRCHG circuit 362 includes an AND gate 366 that receives a PRCHG signal and an ML_EN signal of the corresponding row segment. An ML_EN signal of a logic high state indicates a match in the corresponding row segment in the first stage 110. For example, ML_EN(0) enables ML2(0) to be pre-charged to logic high before the search for the second portion search key is performed in the second stage 120.

The wired-OR circuit 370 receives input from ML1s of all R row segments in the first stage 110 and performs logic OR operation on all of the ML1s. The output of the wired-OR circuit 370 propagates through a D flip-flop 372 in the next clock to serve as an SL enable (SL_EN) signal for the second stage 120. It is noted that each sub-bank generates its own SL_EN according to the match outcome in the first stage of the same sub-bank. That is, SL_EN is a sub-bank level enable signal. An asserted (e.g., logic high) SL_EN signal enables search (i.e., compare) operations in the second stage 120. The SL_EN signal is a gating signal at the input of a second-stage driver 332. An asserted SL_EN indicates a match in one or more row segments of the first stage 110 and enables the second portion search key to propagate forward to the second-stage SL pairs. The second-stage driver 332 includes a pair of 3-input AND gate (e.g., AND gates 381 and 382) for each second-stage SL pair. The AND gate 381 receives SL_EN, a clock signal CCLK, and a search key bit D2_in(k) as input, and the AND gate 382 receives SL_EN, a clock signal CCLK, and the inverted search key bit as input.

Figure 4:
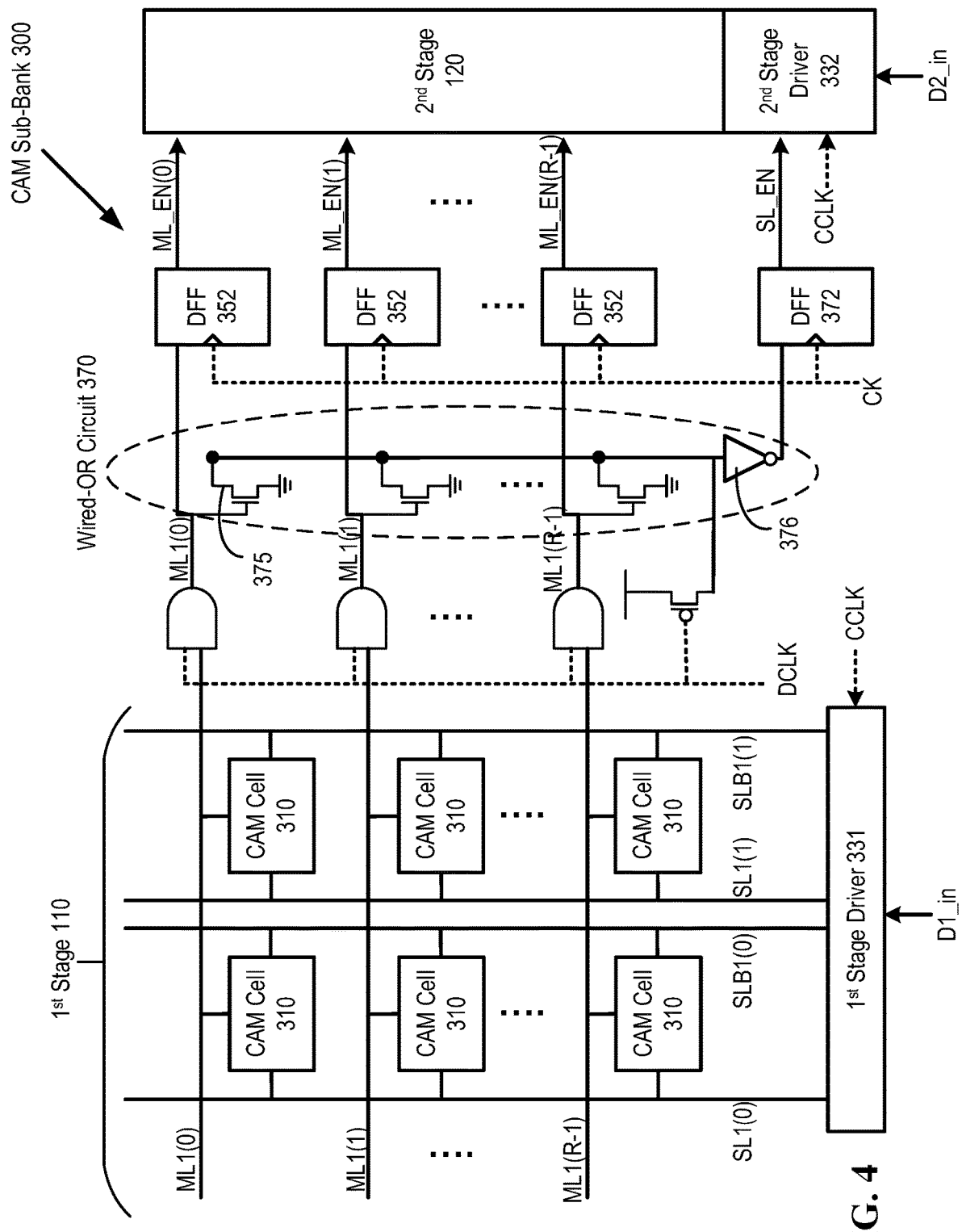
FIG. 4 illustrates a wired-OR circuit according to one embodiment.

FIG. 4 illustrates further details of the wired-OR circuit 370 according to one embodiment. For simplicity of the illustration, not all rows and columns of CAM cells are shown in each of the first stage 110 and the second stage 120. The wired-OR circuit 370 includes R rows of switches 375 followed by an inverter 376. The switches 375 are connected in parallel with all of the output terminals connected to each other and all of the input terminals grounded. The gate terminal of each switch 375 is connected to the corresponding ML1 in the same row segment. Take the top row segment as an example, when a match is found in the top row segment of the first stage 110, ML1(0) is in a logic high state. The corresponding switch 375 is turned on, which causes its output terminal to be pulled down to the ground. When any of the switches 375 is turned on, all of the output terminals of the switches 375 are pulled to the logic low state (e.g., the ground), and the inverter 376 outputs an SL_EN signal with a logic high state (i.e., an asserted SL_EN).

Thus, the wired-OR circuit 370 performs the Boolean operation of OR on all of the first-stage MLs. One or more first-stage row segments with logic high ML1 causes the wired-OR circuit 370 to assert SL_EN. SL_EN is de-asserted when none of the first-stage row segments have a logic high ML1 (i.e., no match in the first stage 110). The search key input to the second stage 120 is gated by SL_EN and a clock signal (CCLK). Thus, when there is no match in the first stage 110, no search can be performed in the second stage 120.

FIG. 4 shows some of the clock signal connections in the sub-bank 300 as dotted lines. For example, the wired-OR circuit 370 may be gated at the input (i.e., ML1s) and the output (i.e., at the inverter 376) by a clock signal (DCLK). All of the D flip-flops 352 may be gated by another clock signal (CK). Furthermore, the first-stage driver 331 and the second-stage driver 332 may be gated by yet another clock signal (CCLK). It is understood that the dynamically gated search lines technique may apply to a sub-bank that uses different clock signals.

Figure 5:
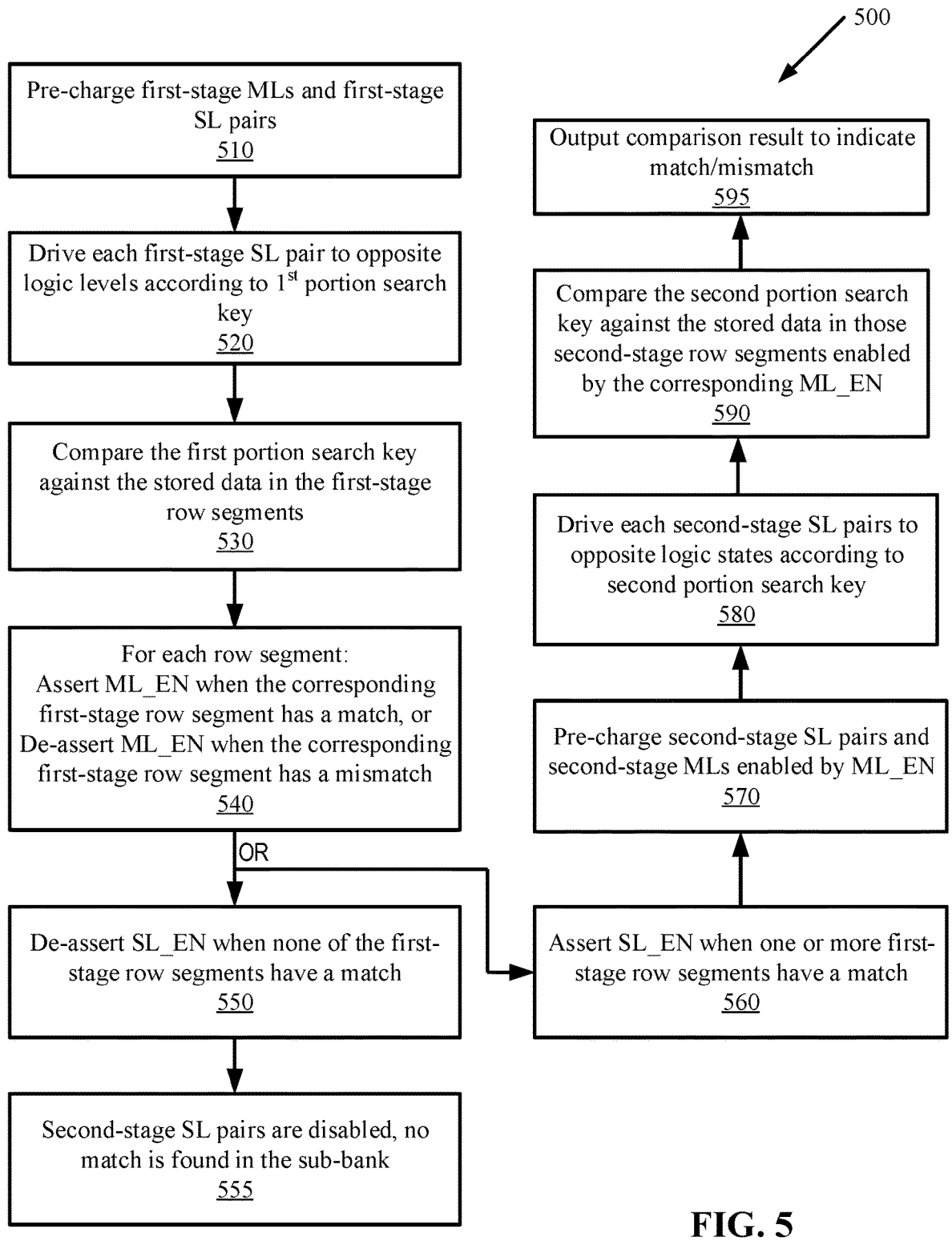
FIG. 5 is a flow diagram illustrating a process performed by a sub-bank of a CAM device according to one embodiment.

FIG. 5 is a flow diagram illustrating a process 500 performed by a sub-bank of a CAM device according to one embodiment. Some examples of the sub-bank have been provided in FIGS. 1-4. At step 510, the first-stage MLs (e.g., ML1s) and the first-stage SL pairs (e.g., SL1s and SLB1s) are pre-charged (e.g., to logic high). In some embodiments, the pre-charged ML1s are those corresponding to valid CAM row entries, as indicated by the corresponding VBIT indicators. At step 520, the first-stage driver drives each first-stage SL pair to opposite logic levels according to the first portion search key. For example, if the first bit of the search key is 1, SL1 and SLB1 of the first column may be driven to high and low logic states, respectively. If the first bit of the search key is 0, SL1 and SLB1 of the first column may be driven to low and high logic states, respectively. At step 530, the first portion of the search key is compared against the stored data in the first-stage row segments; e.g., each first-stage CAM cell compares its stored value with logic levels of the corresponding SL pair. At step 540, assert ML_EN of a row segment (e.g., to logic high) when the corresponding first-stage row segment has a match, or de-assert ML_EN of a row segment (e.g., to logic low) when the corresponding first-stage row segment has a mismatch. Process 500 proceeds to either step 550 or step 560. At step 550, SL_EN is de-asserted (e.g., to logic low) when none of the first-stage row segments have a match, and at step 555, the second-stage SL pairs are disabled; thus, no match is found in the sub-bank.

When process 500 proceeds to step 560, SL_EN is asserted (e.g., to logic high) when one or more first-stage row segments have a match. Continuing to step 570, for each second-stage row segment enabled by ML_EN, the corresponding second-stage ML (e.g., ML2) is pre-charged to logic high. Moreover, all of the second-stage SL pairs (e.g., SL2s and SLB2s) are pre-charged to logic high. At step 580, the asserted SL_EN enables each second-stage SL pair to be driven to opposite logic states according to the corresponding bit value of the second portion search key. At step 590, the second portion search key is compared against the stored data in those second-stage row segments enabled by the corresponding ML_EN. At step 595, the comparison result is output to indicate a match or mismatch. The output may also include the row index or indices of the matching entries.

Figure 6:
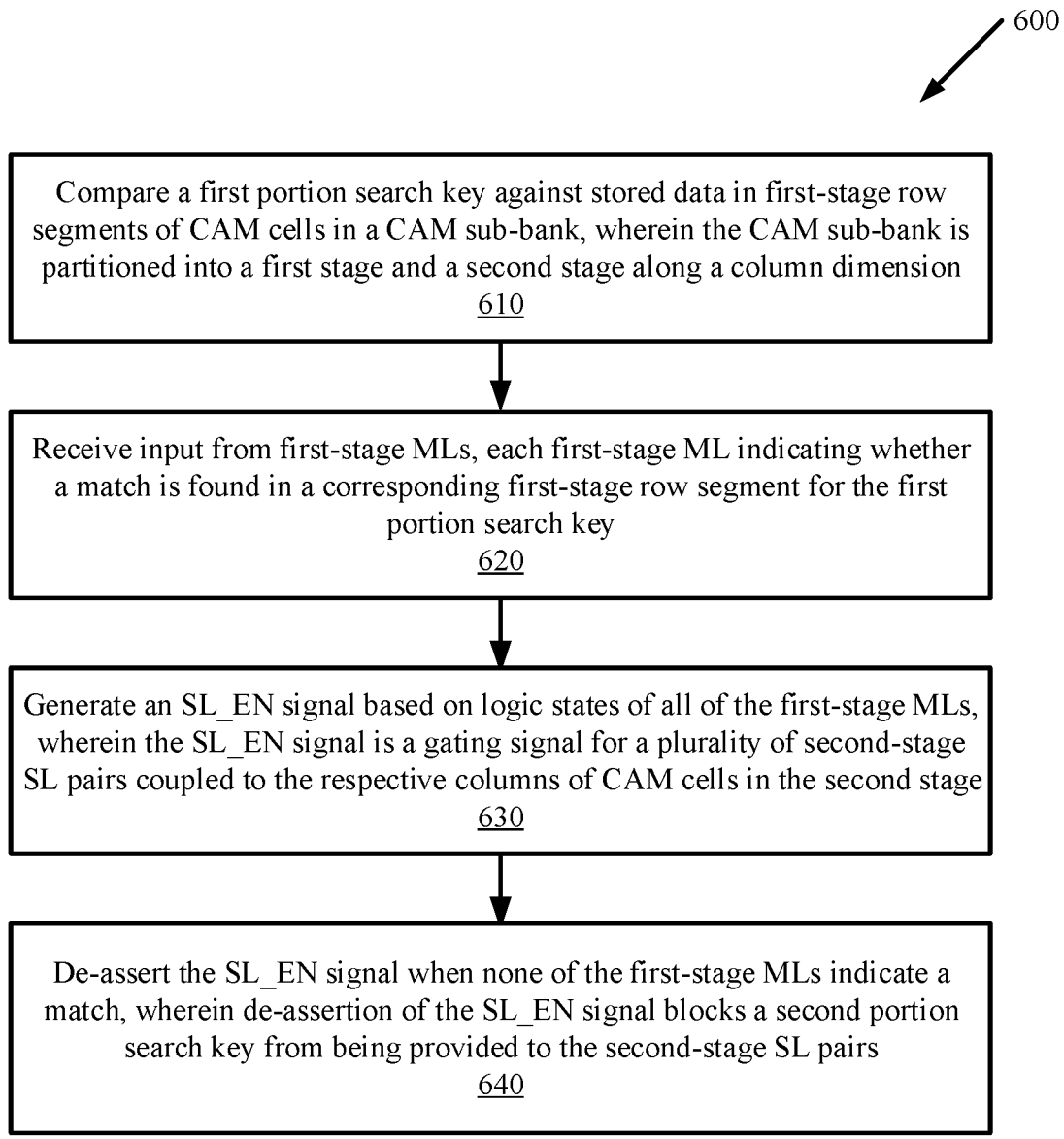
FIG. 6 is a flow diagram illustrating a method for dynamically gated search lines in a sub-bank according to one embodiment.

FIG. 6 is a flow diagram illustrating a method of dynamically gated search lines in a sub-bank according to one embodiment. The method 600 may be performed by the sub-bank illustrated in FIGS. 1-4. Each sub-bank includes an array of CAM cells arranged in rows and columns. The sub-bank is partitioned into a first stage and a second stage along a column dimension.

At step 610, a first portion search key is compared against stored data in first-stage row segments of CAM cells in the sub-bank. At step 620, the sub-bank includes a circuit that receives input from first-stage MLs, each of which indicates whether a match is found in a corresponding first-stage row segment for the first portion search key. At step 630, the circuit generates an SL_EN signal based on the logic states of all of the first-stage MLs. The SL_EN signal is a gating signal for second-stage SL pairs that are coupled to the respective columns of CAM cells in the second stage. At step 640, the SL_EN signal is de-asserted when none of the first-stage MLs indicate a match. De-assertion of the SL_EN signal blocks a second portion search key from being provided to the second-stage SL pairs.

The operations of the flow diagrams of FIGS. 5 and 6 have been described with reference to the exemplary embodiments of FIGS. 1-4. However, it should be understood that the operations of the flow diagrams of FIGS. 5 and 6 can be performed by embodiments of the invention other than those discussed with reference to FIGS. 1-4, and the embodiments discussed with reference to FIGS. 1-4 can perform operations different than those discussed with reference to the flow diagrams. While the flow diagrams of FIGS. 5 and 6 show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A content addressable memory (CAM) device, comprising:
 a plurality of CAM sub-banks, each CAM sub-bank comprising:

an array of CAM cells arranged in rows and columns and partitioned into a first stage and a second stage along a column dimension;

a plurality of first-stage match lines (MLs) coupled to the respective rows of CAM cells in the first stage, each first-stage ML to indicate whether a match is found in a corresponding first-stage row segment for a first portion search key;

a plurality of first-stage search line (SL) pairs in the first stage;

a plurality of second-stage MLs coupled to the respective rows of CAM cells in the second stage;

a plurality of second-stage SL pairs coupled to the respective columns of CAM cells in the second stage;

a circuit operative to receive all of the first-stage MLs as input and generate an SL enable (SL_EN) signal as output, wherein the SL_EN signal is a gating signal for the plurality of second-stage SL pairs, the circuit is further operative to de-assert the SL_EN signal when none of the first-stage MLs indicate a match, wherein de-assertion of the SL_EN signal blocks a second portion search key from being provided to the second-stage SL pairs; and an output circuit operative to indicate a match between a search key and data stored in one or more rows in the CAM sub-banks, wherein the search key includes the first portion search key provided to the first stage and the second portion search key provided to the second stage.

2. The CAM device of claim 1, wherein the circuit is further operative to assert the SL_EN signal when one or more of the first-stage MLs indicate a match for the first portion search key.

3. The CAM device of claim 1, wherein the circuit further includes a wired-OR circuit operative to perform a logic OR operation on all of the first-stage MLs to generate the SL_EN signal.

4. The CAM device of claim 1, wherein the circuit further includes a clock-gated flip-flop that receives a first-stage ML indicating a match in a first-stage row segment and outputs an ML enable (ML_EN) signal to enable pre-charging of a corresponding second-stage ML.

5. The CAM device of claim 1, wherein each of the CAM sub-banks is part of a CAM bank that is partitioned into the CAM sub-banks along a row dimension.

6. The CAM device of claim 1, wherein each of the CAM sub-banks generates a corresponding SL_EN signal to indicate a match in a corresponding first stage of the CAM sub-bank.

7. The CAM device of claim 1, wherein the first stage and the second stage include a same number of columns of CAM cells.

8. The CAM device of claim 1, wherein the first stage includes fewer columns of CAM cells than the second stage.

9. The CAM device of claim 1, wherein each of the CAM cells is a ternary CAM (TCAM) cell.

10. The CAM device of claim 1, wherein each second-stage SL pair is coupled to a pair of AND gates, the pair of AND gates including a first AND gate that receives the SL_EN signal, a clock signal, and a search key bit input, and a second AND gate that receives the SL_EN signal, the clock signal, and an inverted search key bit input.

11. A method performed by each of a plurality of content addressable memory (CAM) sub-banks of a CAM device, each CAM sub-bank including an array of CAM cells arranged in rows and columns, comprising:

comparing a first portion search key against stored data in first-stage row segments of CAM cells, wherein the CAM sub-bank is partitioned into a first stage and a second stage along a column dimension;

receiving input from first-stage match lines (MLs), each first-stage ML indicating whether a match is found in a corresponding first-stage row segment for a first portion search key;

generating a search line enable (SL_EN) signal based on logic states of all of the first-stage MLs, wherein the SL_EN signal is a gating signal for a plurality of second-stage search line (SL) pairs coupled to the respective columns of CAM cells in the second stage; and de-asserting the SL_EN signal when none of the first-stage MLs indicate a match, wherein de-assertion of the SL_EN signal blocks a second portion search key from being provided to the second-stage SL pairs.

12. The method of claim 11, further comprising:
asserting the SL_EN signal when one or more of the first-stage MLs indicate a match.

13. The method of claim 11, further comprising:
comparing the second portion search key against stored data in second-stage row segments of CAM cells when the SL_EN signal is asserted.

14. The method of claim 11, further comprising:
performing a logic OR operation on all of the first-stage MLs to generate the SL_EN signal.

15. The method of claim 11, further comprising:
generating an ML enable (ML_EN) signal to enable pre-charging of a second-stage row segment when a corresponding first-stage row segment has a match.

16. The method of claim 11, further comprising:
pre-charging a first-stage ML when a corresponding valid bit indicator indicates validity of a corresponding row of CAM cells.

17. The method of claim 11, further comprising:
outputting a match indication when a match is found between a search key and data stored in one or more rows in the CAM sub-banks, wherein the search key includes the first portion search key provided to the first stage and the second portion search key provided to the second stage.

18. The method of claim 11, wherein each of the CAM cells is a ternary CAM (TCAM) cell.

19. The method of claim 11, wherein each of the CAM sub-banks is part of a CAM bank that is partitioned into the CAM sub-banks along a row dimension.

* * * * *